United States Patent
Scholz et al.

(10) Patent No.: US 9,901,001 B2
(45) Date of Patent: Feb. 20, 2018

(54) RETAINING APPARATUS FOR A TERMINAL DEVICE THAT CAN BE COUPLED IN A WIRELESS MANNER, AND METHOD FOR PRODUCING A RETAINING APPARATUS

(71) Applicant: LAIRD DABENDORF GMBH, Dabendorf (DE)

(72) Inventors: Frank Scholz, Berlin (DE); Rainer Holz, Berlin (DE)

(73) Assignee: Laird Dabendorf GmbH, Dabendorf (DE)

( * ) Notice: Subject to any disclaimer, the term of this patent is extended or adjusted under 35 U.S.C. 154(b) by 0 days.

(21) Appl. No.: 14/761,019

(22) PCT Filed: Jan. 16, 2014

(86) PCT No.: PCT/EP2014/050826
§ 371 (c)(1),
(2) Date: Jul. 15, 2015

(87) PCT Pub. No.: WO2014/111478
PCT Pub. Date: Jul. 24, 2014

(65) Prior Publication Data
US 2015/0373866 A1 Dec. 24, 2015

(30) Foreign Application Priority Data
Jan. 18, 2013 (DE) .................. 10 2013 200 811

(51) Int. Cl.
*H05K 5/02* (2006.01)
*G06F 1/16* (2006.01)
(Continued)

(52) U.S. Cl.
CPC ......... *H05K 5/0217* (2013.01); *F16M 11/041* (2013.01); *F16M 13/00* (2013.01);
(Continued)

(58) Field of Classification Search
CPC ......... B60R 2011/0075; B60R 11/0241; B60R 11/0235; B60R 11/02; B60R 2011/0071;
(Continued)

(56) References Cited

U.S. PATENT DOCUMENTS 4,915,273 A 4/1990 Allen
5,187,744 A * 2/1993 Richter ............... B60R 11/0241
224/553

(Continued)

FOREIGN PATENT DOCUMENTS

CN 102463935 A 5/2012
DE 10123556 A1 12/2002
(Continued)

*Primary Examiner* — Dimary Lopez Cruz
*Assistant Examiner* — Abhishek Rathod
(74) *Attorney, Agent, or Firm* — Laurence A. Greenberg; Werner H. Stemer; Ralph E. Locher

(57) ABSTRACT

A retaining device for a terminal which can be coupled in a wireless manner. The retaining device has at least one stand part and at least one movable part. The stand part has at least one bearing surface for the terminal, and the retaining device is formed with at least one conductor structure arranged on the stand side. The movable part has at least one pushing element, the movable part being fixed to the stand part in a movable manner such that a variable distance can be set between the bearing surface and the pushing element. A method for producing a retaining device is described as well.

19 Claims, 7 Drawing Sheets

(51) Int. Cl.
*F16M 11/04* (2006.01)
*F16M 13/00* (2006.01)
*F16M 13/02* (2006.01)
*H02J 7/00* (2006.01)
*B60R 11/02* (2006.01)
*H04M 1/04* (2006.01)
*H02J 7/02* (2016.01)

(52) U.S. Cl.
CPC ........... *F16M 13/02* (2013.01); *H02J 7/0044* (2013.01); *H05K 5/0234* (2013.01); *H05K 5/0247* (2013.01); *B60R 11/02* (2013.01); *G06F 1/1632* (2013.01); *H02J 7/025* (2013.01); *H04M 1/04* (2013.01); *Y10T 29/49842* (2015.01)

(58) Field of Classification Search
CPC ......... B60R 2011/0085; B60R 13/0256; B60R 2011/0082; B60R 2011/0089; F16M 13/00; F16M 11/041; F16M 11/04; H04M 1/6075
See application file for complete search history.

(56) References Cited

U.S. PATENT DOCUMENTS

| | | |
|---|---|---|
| 5,659,887 A | 8/1997 | Ooe |
| 7,940,024 B2 | 5/2011 | Zhang et al. |
| 8,744,536 B2 | 6/2014 | Brzana |
| 2005/0007067 A1 | 1/2005 | Baarman et al. |
| 2007/0101372 A1 | 5/2007 | Chang |
| 2009/0021211 A1* | 1/2009 | Zhang .................... H02J 7/025 320/108 |
| 2009/0270727 A1 | 10/2009 | Zhao et al. |
| 2010/0007805 A1 | 1/2010 | Vitito |
| 2012/0091948 A1 | 4/2012 | Shinde et al. |
| 2013/0206942 A1* | 8/2013 | Trotsky ................ F16M 11/041 248/274.1 |
| 2013/0324198 A1 | 12/2013 | Lachnitt |

FOREIGN PATENT DOCUMENTS

| | | |
|---|---|---|
| DE | 202010007001 U1 | 8/2010 |
| DE | 202011052313 U1 | 1/2012 |
| DE | 102011100540 A1 | 10/2012 |
| DE | 102011120194 A1 | 6/2013 |
| DE | 102013004442 A1 | 12/2013 |
| FR | 2946830 A1 | 12/2010 |
| WO | 2009012033 A1 | 1/2009 |

* cited by examiner

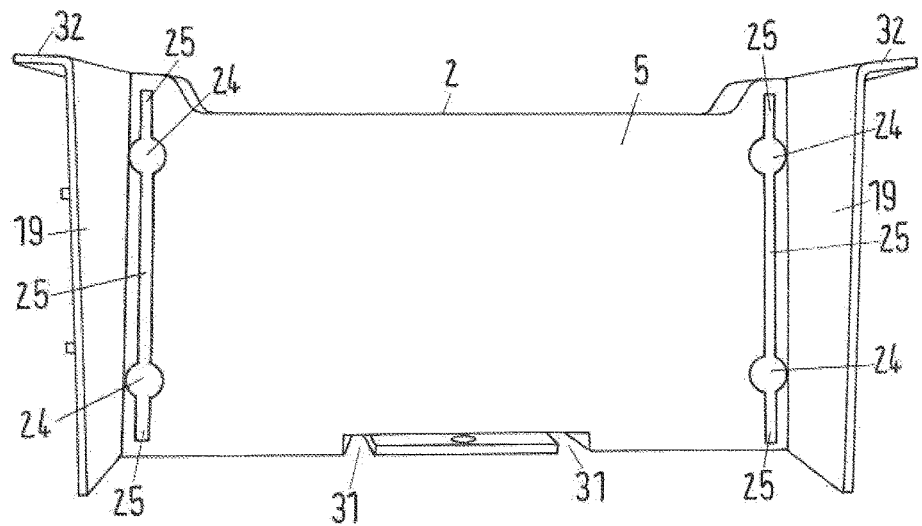
FIG. 7
FIG. 8
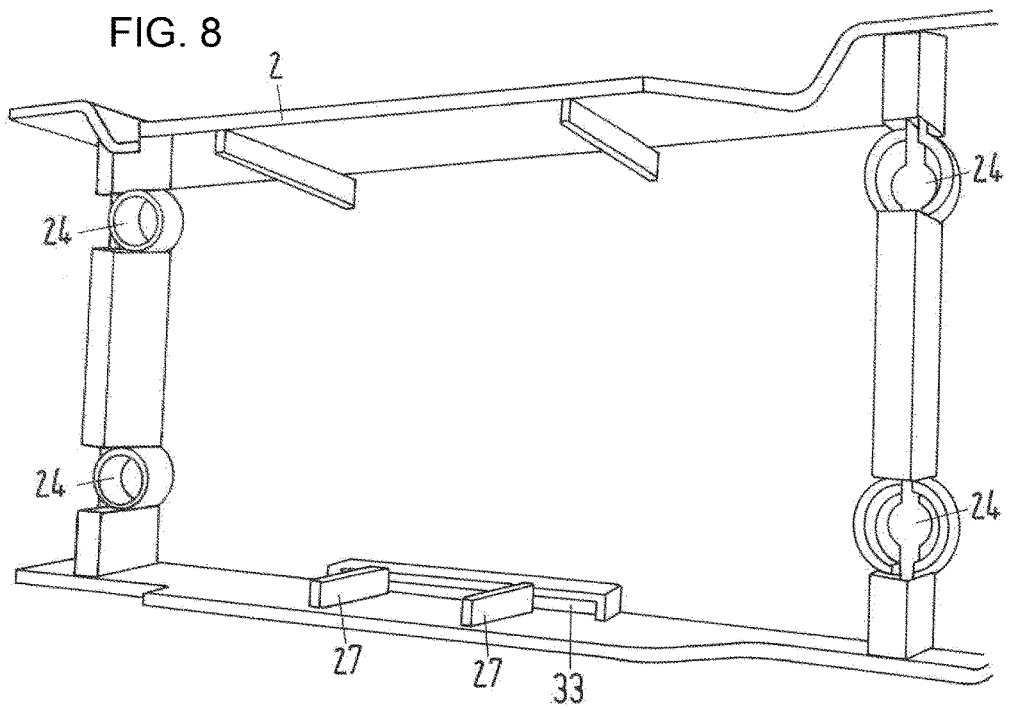

RETAINING APPARATUS FOR A TERMINAL DEVICE THAT CAN BE COUPLED IN A WIRELESS MANNER, AND METHOD FOR PRODUCING A RETAINING APPARATUS

BACKGROUND OF THE INVENTION

Field of the Invention

The invention relates to a retaining apparatus for a terminal device that can be coupled in a wireless manner, and also to a method for producing such a retaining apparatus.

Terminal devices, in particular portable electric or electronic terminal devices, for example mobile telephones, PDAs (personal digital assistants), audio and video playback devices, cameras, loudspeakers and microphone units that can be worn on the body (what are known as headsets), pocket torches, toothbrushes and coffee cups with integrated heating, to name just a few, have an energy store for supplying the electric device with electrical energy. Otherwise, the terminal device could not be operated or could only be operated with permanent external supply of electrical energy. In order to charge the energy store or in order to operate the terminal device, a cable connection to the electric terminal device is traditionally produced.

However, methods for the cable-free or wireless transfer of electrical energy to the terminal device are also known. For example, an inductive transfer of electrical energy to the terminal device can be provided, whereby the energy store of the terminal device can be charged and/or the terminal device can be operated. Here, an electromagnetic alternating field is generated by a primary-side conductor structure, in particular a primary-side coil arrangement, which alternating field is received by a secondary terminal device-side conductor structure, the secondary conductor structure generating a secondary-side alternating current.

A cable-free or wireless communication between a terminal device and further devices, for example via a radio link, is also known.

In some applications it is desirable for the terminal device to be located in a predetermined position in order to enable an optimal wireless transfer of electrical energy and/or a wireless transfer of data. For example, it is thus desirable for the terminal device to be located in the event of inductive charging in a predetermined position and/or with a predetermined arrangement relative to a primary-side conductor structure, whereby an optimal inductive transfer of electrical energy is made possible.

In motor vehicles also, there is the need to inductively charge terminal devices, in particular portable terminal device, and/or to enable wireless communication between the terminal device and for example a communication system of the vehicle. However, in particular in driving mode, an unfixed device may shift, whereby the quality of an inductive energy transfer is reduced and/or a wireless communication may be disturbed.

US 2005/0007067 A1 discloses an apparatus for supplying power to a battery in a portable device, the apparatus comprising a primary part for supplying power to the battery and means for receiving power, the means for receiving power being coupled to the battery. The means for receiving power are capable of receiving power from the primary part independently of an orientation of the means for receiving power. The document also describes a holder for portable devices. This holder is formed as a pocket, and portable terminal devices can be held by adhesive strips or clips.

The technical problem is encountered of creating a retaining apparatus and a method for producing a retaining apparatus for terminal devices that can be coupled in a wireless manner and that have different dimensions, which retaining apparatus and which method enable a reliable and quality-optimized wireless transfer of electrical energy and/or wireless communication to/with the terminal device, the operability of the retaining apparatus being simplified with regard to the insertion and removal of the terminal device.

The technical problem is solved by the subjects having the claimed features. Further advantageous embodiments of the invention are clear from the dependent claims.

BRIEF SUMMARY OF THE INVENTION

A basic concept of the invention is that a retaining apparatus having a variable receiving volume is created, which can hold or mechanically fix in a predetermined position and/or orientation a terminal device introduced into the receiving volume, the terminal device being insertable into and removable from the receiving volume in a simple, in particular one-handed, manner.

A retaining apparatus for a terminal device that can be coupled in a wireless manner, in particular a mobile telephone, is proposed.

Here, the wireless coupling may be a wireless coupling for the transfer of electrical energy to the terminal device, for example in order to charge an energy store of the terminal device and/or in order to operate the terminal device. In particular, the retaining apparatuses may be a retaining apparatus for a terminal device that can be charged inductively. Alternatively or in addition, the wireless coupling may be a coupling for the wireless communication of the terminal device with further devices.

The retaining apparatus comprises at least one stand part and at least one movable part. Here, the stand part may be a part arranged in a stationary manner. The stand part may be arranged in a vehicle, in particular in a car. By way of example, the stand part may be secured to an internal trim, for example to an internal trim of a vehicle door, or to a front console, or may be formed by this internal trim. It is also possible to arrange the stand part on a center console, for example on a side wall of a center console.

The stand part can be secured here by means of a fastening apparatus to a vehicle part, for example to a console, and in particular may be secured detachably.

The stand part has at least one bearing surface or a bearing element or forms this. The bearing surface or the bearing element here may have a predetermined size. In particular the size of the bearing surface may be the same as the size of the terminal device or larger than the size of the terminal device. It is also conceivable, however, that the size of the bearing surface is smaller than the size of the terminal device. The bearing surface in particular is a flat bearing surface In particular a width of the bearing surface may be greater than a predetermined maximum width and/or a length of the bearing surface may be greater than a predetermined maximum length, the maximum width and/or length being selectable in a manner dependent on a size of the terminal devices to be fixed.

The bearing surface here may be delimited by at least one side wall or may be formed without side wall(s).

The retaining apparatus also comprises at least one conductor structure arranged on the stand side. The conductor structure here may be a primary-side conductor structure, in particular a winding or coil arrangement, for generating an electromagnetic alternating field for an inductive transfer of electrical energy to the terminal device. In this case the terminal device may comprise a secondary-side conductor structure, in particular a winding or coil arrangement, for receiving the electromagnetic alternating field.

Alternatively, however, the conductor structure may also be an antenna structure for unidirectional or bidirectional wireless communication with the terminal device.

However, the retaining apparatus may also comprise both a stand-side conductor structure for the inductive transfer of electrical energy and a further stand-side conductor structure for wireless communication. Here, stand-side means that the stand-side conductor structure is also arranged in a stationary manner. By way of example, it may be secured to the stand part or may be an integral part of the stand part. The conductor structure may also be arranged on or in a carrier structure, for example a circuit board, a housing, or in a conductor guide element, the carrier structure being secured to the stand part or being arranged with a predetermined position and/or orientation relative to the stand part.

The retaining apparatus may thus comprise means for wireless energy transfer. Alternatively or in addition, the retaining apparatus may comprise at least one means for wireless signal transfer between the terminal device and the retaining apparatus, the signal transfer in particular being used possibly for wireless communication. By way of example, the retaining apparatus may comprise a first means for wireless signal transfer between an antenna of the terminal device and the retaining apparatus. This signal transfer can be used for example in order to transfer communication signals of the terminal device to an external antenna or from an external antenna of the vehicle to the terminal device. Further, the retaining apparatus may comprise a further means for the wireless transfer of data signals and/or control signals between the terminal device and the retaining apparatus. These signals can be used for example for the on-board control or operation of the terminal device or for the on-board use, for example display, of information of the terminal device.

Of course, the means for energy transfer and/or for signal transfer may also be formed in such a way that a wired or cabled energy transfer and/or signal transfer is possible between retaining apparatus and terminal device. By way of example, means of this type may comprise at least one plug and/or at least one cable, which for example enable a connection of at least one interface on the retaining device side and an interface on the terminal device side.

In accordance with the invention the movable part has at least one pushing element. The pushing element can be formed for example as a pushing surface. Alternatively, the pushing element can also be formed as a point or line. The pushing element serves to produce mechanical contact between the movable part and the terminal device. The movable part of the retaining apparatus is secured movably to the stand part or is connected thereto in such a way that a variable distance between the bearing surface and the pushing element can be set. A volume or space between the bearing surface and the pushing element here is part of a receiving volume, into which the terminal device can be introduced or from which the terminal device can be removed. Terminal devices having different dimensions, in particular thicknesses, can be arranged between the bearing surface and the pushing element due to the variable distance. The bearing surface is used here to produce mechanical contact between the stand part and the terminal device when this is arranged in the receiving volume.

In particular, the at least one pushing element can enter into mechanical contact with a front side of the terminal device, the front side of the terminal device possibly having a display. In this case a rear side of the terminal device, i.e. a side opposite the front side, may rest on the bearing surface.

Here, the movable part may be secured to the stand part in a manner fixed against movement in translation and/or non-rotatably, the variable distance being adjustable on account of a resilient deformation of the movable part. However, as will be explained in greater detail hereinafter, the movable part is preferably secured to the stand part in such a way that the movable part can be moved with a rotational movement and/or a movement in translation, the variable distance being adjustable on account of the movability of the movable part. However, this does not rule out the fact that the movable part is additionally resiliently deformable, the variable distance additionally being adjustable on account of a resilient deformation of the movable part.

The movable part here can be secured to the stand part in such a way that a set distance is a stable distance. This means that the set distance can be changed only by an actuation of the movable part by means of an actuation force that is identical to or greater than a predetermined force. A terminal device can thus be arranged between the bearing surface and the movable part, and the movable part can be moved in such a way that the terminal device is clamped between the bearing surface or the bearing element and the pushing element, both the bearing surface and the pushing element being in mechanical contact with the terminal device.

By way of example, the movable element, in particular the pushing element, can be moved in a vertical direction toward the bearing surface until a mechanical contact of the terminal device both with the bearing surface and with the pushing element is produced. The vertical direction describes a direction that is oriented perpendicularly to the bearing surface. A terminal device can thus be clamped between the bearing surface and the pushing element. A movement of the movable part in the vertical direction away from the bearing surface is only possible here when the actuation force is applied to the movable part. A movement in the vertical direction also includes the case that the movable part, in particular the pushing element, is moved in a direction toward the bearing surface comprising at least one portion oriented in the vertical direction. By way of example, as will be explained in greater detail hereinafter, the movable part may perform a rotational movement, which is performed about an axis of rotation, the axis of rotation possibly running parallel to the bearing surface. Alternatively or in addition, the movable part may perform a movement in translation. By way of example, the movement, in particular the movement in translation, in the vertical direction may also be a movement that is oriented exclusively in or against the vertical direction. A terminal device arranged between the bearing surface and the pushing element can thus be held advantageously in a stable manner. It should be noted that with such a configuration it is not absolutely necessary to generate any additional force, i.e. in particular it is not necessary to generate any force at all, on the terminal device acting in the direction of the bearing surface when the terminal device is arranged between the bearing surface and the pushing element.

The distance between the bearing surface and pushing element can be measured here in the previously mentioned vertical direction.

The proposed retaining apparatus advantageously enables a stable hold of terminal devices having different shapes and sizes. Simple operation, in particular one-handed operation, of the retaining apparatus when inserting and removing the terminal device is also possible. A user can thus move the movable part away from the bearing surface, for example in the vertical direction, arrange the terminal device between the bearing surface and pushing element, and then move the movable part toward the bearing surface until mechanical contact or a frictional connection is produced between the pushing element and the terminal device and also the terminal device and the bearing surface. In this case the terminal device rests on the preferably flat bearing surface, whereby the terminal device is located at a desired distance from the previously explained conductor structure.

By means of the retaining apparatus, a detachable fixing is advantageously made possible for a plurality of terminal devices having different dimensions, which fixing, in particular even in driving mode of the vehicle, enables a fixing of the terminal device in such a way that there is no, or only a slight, change of the arrangement and/or position of the terminal device.

The proposed retaining apparatus here can be arranged for example in a vehicle in such a way that the bearing surface is a horizontal or a vertical surface. Due to the proposed retaining apparatus, it is thus made possible for the terminal device to be retained horizontally or vertically. Here, a horizontal bearing surface may be oriented orthogonally to a yaw axis of the vehicle. Further, the yaw axis may be oriented parallel to a vertical bearing surface. The vertical bearing surface may also be oriented orthogonally to a roll axis or a pitch axis of the vehicle. The bearing surface may also be an inclined surface, at least one component of at least one vector that spans the plane comprising the bearing surface being oriented parallel to the yaw axis.

The yaw axis, roll axis and pitch axis here may define a vehicle coordinate system. In other words, the proposed retaining apparatus can be arranged in the vehicle in such a way that the receiving volume is open upwardly or at least partially upwardly in relation to the vehicle coordinate system, whereby a terminal device can be introduced from above into the receiving volume. Alternatively or in addition, the proposed retaining apparatus can be arranged in the vehicle in such a way that the receiving volume is open to the front or to the rear or at least partially to the front or to the rear and/or toward a vehicle side or at least partially toward a vehicle side in relation to the vehicle coordinate system.

In a further embodiment the conductor structure is arranged at a predetermined distance from the bearing surface and/or with a predetermined orientation relative to the bearing surface. Here, the distance can be measured for example in the previously explained vertical direction. The conductor structure may preferably be arranged distanced from the bearing surface in the vertical direction at a distance from 1 mm to 3 mm. It is thus ensured that an optimal distance is provided for example for an inductive transfer of electrical energy between a terminal device arranged on the bearing surface and the conductor structure. The quality of an inductive energy transfer can be improved as a result.

In a further embodiment the movable part is secured movably to the stand part in such a way that the movable part is movable by means of a rotational movement. In other words, this means that the movable part may be pivotable. An axis of rotation, about which the rotational movement can be performed, may be oriented or may run in particular parallel to the bearing surface.

For example, the movable part may be mounted rotatably on the stand part, for example by means of at least one bearing arrangement, for example by means of a radial bearing arrangement. By way of example, the movable part may have at least one pin, a central centerline or axis of symmetry of the pin running parallel to the axis of rotation, the pin being mounted rotatably on the stand part. Here, the pin can be mounted for example by means of a sliding bearing arrangement or a rolling bearing arrangement.

By way of example the least one pin can extend into a recess in the stand part, for example into a circular recess or an elongate recess. Here, the recess may be formed by a blind bore or a groove. The recess may also be formed as a through-hole.

Alternatively or in addition, the movable part is secured to the stand part in such a way that the movable part is movable by means of a movement in translation.

The movement in translation may be a linear movement. At least one component of the movement in translation may be oriented in or against the vertical direction. The movement in translation is preferably oriented exclusively in or against the vertical direction.

It is possible that the movable part is secured to the stand part non-rotatably, but movably by means of the movement in translation. It is also possible that the movable part is secured to the stand part in a manner fixed against a movement in translation, but movably by means of the rotational movement. It is also possible that the movable part is secured to the stand part movably both by means of the movement in translation and by means of the rotational movement. In this case it is possible that the rotational movement and the movement in translation can be performed at the same time or sequentially.

Of course, the movable part and/or the stand part may have guide means for guiding the rotational movement and/or the movement in translation.

The movable part can be secured to the stand part in particular in such a way that at least one latching position, preferably a plurality of latching positions, is/are arranged or provided along a trajectory of the rotational movement and/or the movement in translation.

The fact that the movable part can be moved by means of a movement in rotation may mean in this case that all latching positions of a rotational movement lie on a circular line. The fact that the movable part is movable by means of a movement in translation may mean in this case that all latching positions of a movement in translation lie on a straight line.

In a latching position the movable part may be movable out from the latching position only with an actuation of the movable part by means of an actuation force that is equal to or greater than a predetermined release force. The release force in particular may be greater than a movement force that has to be exerted onto the movable part in order to move the movable part along the corresponding trajectory.

For this purpose, suitable means for fixing, for example latching arrangements or latching means, may be provided on the movable part and/or on the stand part.

By way of example, the linear movement may have at least two, for example three, latching positions, the rotational movement not having any latching positions.

It is also possible that the movable part is movable along a trajectory of the rotational movement and/or the movement in translation in various positions. These positions can be determined for example by the previously explained latching positions. The movable part may thus be movable for example into a release position and into a fixing position.

A particularly good and easily operable adjustment of the receiving volume can thus be provided advantageously.

In a preferred embodiment the movable part is secured movably to the stand part in such a way that an axis of rotation of the rotational movement is movable by means of a movement in translation. The axis of rotation of the rotational movement designates the axis about which the rotational movement can be performed.

For example, the axis of rotation can thus be moved by means of a movement in translation into various latching positions of the movement in translation, a rotation of the movable part about the axis of rotation being possible in each latching position.

A particularly good operability is thus provided advantageously, since both the rotational movement and the movement in translation can be performed by an actuation process, for example the actuation by a finger of a user.

In a further embodiment the retaining apparatus comprises at least one means for force generation, the means for force generation being formed and/or arranged in such a way that a force oriented in the direction of the bearing surface acts on the movable part when a distance between the bearing surface and the pushing element is greater than zero or greater than a predetermined distance, which is greater than zero. Here, a distance of zero means that the pushing element is in mechanical contact with the bearing surface. The means for force generation may also be formed and/or arranged in such a way that a force oriented in the direction of the bearing surface then also acts on the movable part when the distance is zero.

The means for force generation may be an active or a passive means for force generation. An active means for force generation here designates a means for force generation that generates a force with consumption of external energy, for example electrical energy. By way of example, an active means for force generation may be an electric motor, for example a linear motor, or a piezo actuator.

The means for force generation is preferably a passive means for force generation, which can generate a force without the supply of external energy, for example electrical energy.

If a terminal device is arranged between the bearing surface and the pushing element, a distance between the bearing surface and the pushing element is thus greater than zero or greater than the predetermined distance. This may be, for example, smaller than a minimum thickness of a terminal device to be retained. In this case a force oriented in the direction of the bearing surface acts on the movable part, whereby the movable part is moved in the direction of the bearing surface until the pushing element rests against the terminal device. However, in this case, a pushing or pressing force acts on the terminal device even in the inserted state of the terminal device, i.e. when the terminal device is arranged between the bearing surface and the pushing element, by means of which force the terminal device is pushed or pressed against the bearing surface and is therefore also held in a stable manner. A magnitude of the force oriented in the direction of the bearing surface is preferably to be selected such that the terminal device is not damaged.

The force oriented in the direction of the bearing surface here may also be provided at least in part by a torque or may designate a torque which is exerted onto the movable part in such a way that it is moved toward the bearing surface in particular by means of a rotational movement. In particular, the torque may be exerted about the previously explained axis of rotation. A rotational movement of the movable part about the axis of rotation toward the bearing surface can thus be effected.

In this case the distance may also designate an angular distance between the bearing surface and the movable part, the angular distance being measurable about the previously explained axis of rotation.

A retaining apparatus is thus also described that comprises at least one means for force generation, the means for force generation being formed and/or arranged in such a way that a force and/or torque oriented in the direction of the bearing surface acts/act on the movable part when an angular distance between the bearing surface and the pushing element is greater than zero or greater than a predetermined angular distance that is greater than zero. Here, an angular distance of zero means that the pushing element is in mechanical contact with the bearing surface. The means for force generation can also be formed and/or arranged in such a way that a torque oriented in the direction of the bearing surface then also acts on the movable part when the angular distance is zero or corresponds to the predetermined distance.

It is also possible that the retaining apparatus comprises at least one means for force generation, the means for force generation being formed and/or arranged in such a way that a force and/or torque oriented in the direction of the bearing surface acts/act on the movable part, as a result of which a rotational movement of the movable part about the axis of rotation toward the bearing surface can be effected, in particular when an angular distance between the bearing surface and the pushing element is greater than zero or greater than a predetermined angular distance that is greater than zero. Alternatively or in addition, the retaining apparatus may comprise at least one means for force generation, the means for force generation being formed and/or arranged in such a way that a force oriented in the direction of the bearing surface acts on the movable part, as a result of which a movement in translation of the movable part toward the bearing surface can be effected, in particular when a distance between the bearing surface and the pushing element is greater than zero or greater than a predetermined distance that is greater than zero.

By means of the force that can be generated by the at least one means for force-generation, the previously explained movement in translation and/or rotational movement can thus be effected. The retaining apparatus may also comprise a first means and a further means for force generation, the previously explained movement in translation being able to be effected by the force that can be generated by the first means for force generation and the previously explained rotational movement can be effected by the force that can be generated by the further means for force generation. Also, only one means for force generation may be provided, either the rotational movement or the movement in translation being able to be effected by the force generated by this means. In this case the remaining movement may be a free movement.

The stability of the hold and therefore also the reliability and robustness of the positioning of the terminal device is thus further improved advantageously. The insertion of the terminal device into the retaining apparatus is also facilitated, since a user in a first step moves the movable part away from the bearing surface, arranges the terminal device between the bearing surface and pushing element, and can then easily release the movable part, after which this automatically clamps the terminal device between the bearing surface and pushing element.

In a further embodiment the means for force generation is formed as a spring element, the stand part and the movable part being mechanically connected via the spring element. The spring element can be formed for example as a helix spring or metal spring. The spring element may also be formed from a resilient material, for example from rubber. The spring element can be biased when a distance between the bearing surface and the pushing element is zero or greater than the previously explained distance. Here, the spring element is an example of a passive means for force generation.

It is also possible for the spring element to be formed as a leaf spring or leg spring. The spring element can also be formed as a torsion spring, in particular when a torque is provided by the means for force generation.

This thus results advantageously in a particularly simple design of the means for force generation, which enables a stable and reliable hold of a terminal device Further, the retaining apparatus may comprise at least one damping means, the damping means being formed and/or arranged in such a way that a speed of a rotational movement and/or of a movement in translation of the movable part, in particular a movement toward the bearing surface, is reduced during the movement. The speed can also be limited to a maximum speed by the at least one damping means.

In a further embodiment the movable part has guide means and the stand part has corresponding counter guide means or forms these. Due to the guide means and the corresponding counter guide means, the movable parts can be guided in such a way that the at least one pushing element can be moved toward the bearing surface or away from the bearing surface by means of a linear movement. The linear movement in particular may be a movement in or against the previously explained vertical direction. The guide means and corresponding counter guide means here cooperate in order to guide the explained movement. In particular, the guide means can be formed as guide slits, guide webs and/or guide grooves. Of course, the guide means may also be formed as a linear bearing. Here, the linear movement may correspond to the previously explained movement in translation.

Of course, the movable part may have or form guide means, and the stand part may have or form corresponding counter guide means, which guide the previously explained rotational movement.

The movable part may also have or form guide means, and the stand part may also have or form corresponding counter guide means, which provide the previously explained latching positions. The movable part can thus be moved into the latching positions by the guide means and counter guide means.

By way of example, the stand part may be a slot or a groove. For guidance, in particular of a movement in translation, a guided part, for example the previously explained pin, of the movable part may be arranged in the slot or the groove.

A width of the slot or of the groove may change along a longitudinal axis of the slot or of the groove. By way of example, the width may change in such a way that at least one longitudinal side of the slot or of the groove has an undulating course. Over the undulating course, troughs for example may provide a latching position, for example for a pin of the movable part.

In particular, the width can change in such a way that the width in one or more first portion(s) is smaller than a diameter of the guided part and in one or more further, in particular adjacent, region(s) is greater than or equal to the diameter of the guided part, these regions here providing latching positions. In particular, a movement of the movable part out from the latching position is then only possible if a force is exerted onto the movable part in such a way that the guided part can be moved through a first portion. For this purpose, the guided part and/or a portion having the slot or the groove may be formed from accordingly yielding or resilient material.

A further simplified operation of the retaining apparatus is advantageously provided as a result, since the guide means or the corresponding counter guide means only allow a movement of the movable part in one direction and a user therefore has to pay less attention in the event of a movement of the movable part.

In a further embodiment the movable part and/or the stand part has at least one stop element or forms this/these, a movement, in particular the previously explained linear movement, of the movable part being limited by the stop element. The operability of the retaining apparatus is thus further simplified advantageously since for example an undesirable detachment of the movable part from the stand part can be avoided by stop elements. Of course, the previously explained rotational movement can also be limited by a stop element.

In a further embodiment the movable part has a front wall. Here, the front wall designates a wall of the movable part that is distanced in the vertical direction from the bearing surface and that for example may run parallel to the bearing surface. The front wall has at least one pushing surface or forms this. This may also mean that only part of the front wall has or forms the pushing surface. The pushing surface is oriented parallel to the bearing surface. The pushing element is thus formed by a pushing surface of the front wall. The terminal device may thus be introduced between the bearing surface and the pushing surface, the terminal device being clamped and thus held between the bearing surface and the pushing surface.

The movable part, besides the front wall, may also have side walls and/or a base part or a base wall. Here, a receiving volume can be enclosed by the bearing surface, the side walls, the base part and the front wall, into which receiving volume the terminal device is inserted. Here, the receiving volume is open toward at least one side, for example toward the end face opposite the base part, such that the terminal device can be inserted into or removed from the receiving volume from this end face.

The side parts or side walls here may be oriented perpendicularly to the front wall. The base wall or the base part may also be oriented perpendicularly to the front wall and to at least one side wall. A cuboidal receiving volume is thus produced.

The receiving volume here may be a volume of variable depth, the depth of the volume being measured along the vertical direction between the bearing surface and the pushing surface.

Due to the formation of the pushing element as a pushing surface, the most uniform distribution possible of a pushing force is provided over the terminal device as the terminal device is held, whereby the risk of damage to the terminal device as it is held is reduced. By providing side parts and/or a base part, the terminal device can be prevented advantageously from falling out from the receiving volume, for example from falling out accidentally as the terminal device is removed from the receiving volume.

In a further embodiment the movable part has a front wall, the front wall, in particular a surface of the front wall, having or forming a predetermined number of pushing portions, in particular at least two pushing portions.

A pushing portion here designates a portion of the front wall that enters into mechanical contact with a terminal device inserted into the receiving volume. In particular, only the pushing portions and not the entire front wall or a large surface portion of the front wall can enter into mechanical contact in this case with a terminal device inserted into the receiving volume.

Here, a pushing portion may be formed as a point, a line, or may be formed flat.

The pushing portions here may be arranged in a predetermined arrangement on the front wall, for example at a predetermined distance from one another. For example, pushing portions may thus enter into mechanical contact with a terminal device inserted into the receiving volume, a region between two, in particular adjacent, pushing portions not entering into mechanical contact with a terminal device inserted into the receiving volume if the pushing portions are in mechanical contact with the terminal device inserted into the receiving volume. By way of example, the pushing portions may be arranged in an edge region of the front wall.

As a result, only certain portions of the movable part can advantageously enter into mechanical contact with an inserted terminal device. For example, an undesirable mechanical contact between actuation elements of the terminal device, for example haptically operable operating elements, and/or a display region of the terminal device and the movable part, can thus be avoided.

In a preferred embodiment at least part of the front wall has a curved surface or forms this. The curved surface here may have one or two main curvatures different from zero. In particular, the curved surface may be formed in a concave manner with respect to the bearing surface. Of course, the front wall may also have a plurality of differently curved surface portions, for example having different main curvatures.

The previously explained pushing portions advantageously can be formed as a result.

In a further embodiment at least part of the bearing surface and/or at least part of the front wall, in particular a surface of the front wall, is ribbed. The bearing surface and/or said at least part of the front wall may thus have or form ribs that run parallel to side parts or side walls, i.e. from a base part toward an end face opposite the base part Alternatively or in addition, the bearing surface and/or said at least part of the front wall may be grained. In this case the corresponding surface may have raised regions in the form of points, partial cylinders or partial spheres, or a raised region with a predetermined surface.

In both cases the bearing surface and/or said at least part of the front wall may enter into mechanical contact with a terminal device inserted into the receiving volume only via the raised regions, i.e. for example a surface of the ribs. This reduces a transfer of thermal energy from the bearing surface to the terminal device, for example of thermal energy generated by a primary-side conductor structure for inductive charging. At the same time, however, a sufficiently high static friction can be generated, such that the terminal device is prevented from shifting in the inserted state.

Further alternatively or additionally, at least part of the bearing surface and/or at least part of the front wall is rubberized. A high coefficient of static friction is thus provided between a terminal device inserted into the receiving volume and the bearing surface and/or the front wall, such that the terminal device is prevented from shifting in the inserted state.

In a further embodiment the front wall of the movable part has a recess. Here, the recess can be formed as a slit or slot. The front wall thus has an opening, through which a user can reach into the receiving volume from outside. For example, the terminal device, when inserted into the receiving volume, can thus be operated by the user, or the removal can be simplified, since an accessibility to the terminal device for the user is facilitated. Here, the recess may extend over an entire height of the front wall. In this case the front wall consists of two separate sub-walls. The recess may also extend only over part of the height of the front wall.

The movable part may have raised regions around the recess, for example on the side opposite the front wall. These prevent the terminal device from slipping through the recess as the terminal device is actuated.

It is also possible for the base part or the base wall to have one or more recess(es), and in particular for the previously specified recess in the front wall to also extend over at least part of the base part or the base wall. A terminal device inserted into the receiving volume may thus advantageously be actuated or displaced from below, which facilitates a removal of the terminal device from the receiving volume.

In a further embodiment the retaining apparatus comprises at least one cushion element, the cushion element being arranged on the stand part or on the movable part. In particular, the commission element can be arranged in such a way that it is arranged between the bearing surface and the pushing element. The commission element serves here as scratch protection. In particular, the cushion element may have a predetermined (low) scratch resistance. Damage to the terminal device, for example a scratching of the terminal device caused by the proposed retaining apparatus, can thus be avoided advantageously. It is also conceivable for corresponding cushion elements to be arranged on some or all surfaces surrounding the receiving volume. For example, a cushion element may also be arranged on one of the previously mentioned side parts and/or on a base part.

Further, at least part of the bearing surface and/or of the movable part, in particular the at least one pushing element, can be resiliently deformable. Damage to the terminal device can thus be avoided.

A method for producing a retaining apparatus for a terminal device that can be coupled in a wireless manner is also proposed. Here, at least one stand part and at least one movable part are provided, the stand part having at least one flat bearing surface for the terminal device. At least one conductor structure is also provided, or a carrier structure comprising or including the conductor structure. The at least one conductor structure is arranged on the stand side, in particular on a rear side of the part of the stand part forming the bearing surface.

In accordance with the invention the movable part is provided with at least one pushing element, in particular a pushing surface, and is secured movably to the stand part in such a way that a variable distance between the bearing surface and the pushing element can be set. As previously explained, a distance set for example by a user may be a stable state.

A simple method for producing a proposed retaining apparatus, in particular a retaining apparatus according to one of the previously explained embodiments, is thus provided advantageously.

What is also described is a method for holding a terminal device. Here, a movable part of a retaining apparatus is moved away from a stand part of the retaining apparatuses in a vertical direction away from a bearing surface of the stand part.

Here, the movable part may perform a rotational movement and/or a movement in translation. It is possible for example that the movable part, during the movement away from the bearing surface, performs exclusively a movement in translation, exclusively a rotational movement, or both a rotational movement and a movement in translation. This movement can be effected for example by manual actuation of the movable part, against the force generated by the previously explained at least one means for force generation.

A terminal device is then arranged physically between the bearing surface and a pushing element of the movable part. After this, the movable part is moved in the vertical direction toward the bearing surface until a mechanical contact or frictional connection between the pushing element of the stand part and the terminal device and also between the terminal device and the bearing surface of the movable part is produced. Here, the movable part may perform a rotational movement and/or a movement in translation. Here, it is also possible that the movable part, during the movement toward the bearing surface, performs exclusively a movement in translation, exclusively a rotational movement, or both a rotational movement and a movement in translation. At least one of the movements can be effected by the force generated by the previously explained at least one means for force generation.

In this state and additional pushing force can be exerted by the movable part onto the terminal device, for example by the previously explained spring element.

The method can be performed in particular by means of a retaining apparatus formed in accordance with one of the previously explained embodiments.

A particularly simple hold of a terminal device in a predetermined position is thus advantageously provided, with which in particular a predetermined arrangement and orientation of the terminal device relative to a conductor structure also arranged on the stand part of the retaining apparatuses can be set.

The invention will be explained in greater detail on the basis of two exemplary embodiments. In the figures:

BRIEF DESCRIPTION OF THE SEVERAL VIEWS OF THE DRAWING

FIG. 7 shows a front view of the stand part illustrated in FIG. 3, and FIG. 8 shows a rear view of the stand part illustrated in FIG. 3.

Hereinafter, like reference signs designate elements having like or similar technical features.

DESCRIPTION OF THE INVENTION

Figure 1:
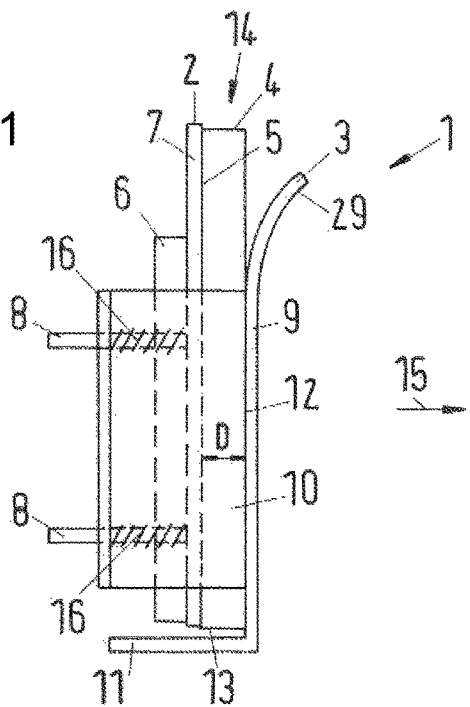
FIG. 1 shows a cross section through a retaining apparatus in a first embodiment.

FIG. 1 illustrates a side view of a retaining apparatus 1 in a first embodiment. The retaining apparatus 1 comprises a stand part 2 and a movable part 3. The retaining apparatus 1 serves to hold a terminal device 4 that can be coupled in a wireless manner. The stand part 2 comprises a rear wall 7, which has a flat bearing surface 5 with predetermined dimensions. The bearing surface 5 is formed here by a front side of the rear wall 7. The retaining apparatus 1 also comprises a conductor structure, which is arranged on the stand side and which is integrated in a carrier block 6, the carrier block 6 being arranged on a rear side of the real wall 7 of the stand part 2 opposite the bearing surface 5. The conductor structure is thus arranged at a predetermined distance from the bearing surface 5. It is also illustrated that the stand part 2 comprises guide pins 8, which extend perpendicularly away from the rear side of the rear wall 7.

The movable part 3 comprises a front wall 9, two side walls 10 and a base wall 11. The movable part 3 is secured to the stand part 2 movably in such a way that a pushing surface 12 formed by the front wall 9 extends parallel to the bearing surface 5. The side wall 10 and the base wall 11 are arranged here on the movable part 3 perpendicularly to the front wall 9 and to the pushing surface 12 respectively. The movable part 3, in particular the front wall 9, the side walls 10 and the base wall 11 and also the stand part 2, in particular the rear wall 7 of the stand part 2, here enclose a receiving volume 13, which is open toward an end face 14 opposite the base wall 11. The terminal device 4 can thus be introduced into the receiving volume 13 from the end face 14. A distance D of the pushing surface 12 from the bearing surface in the vertical direction, symbolized by an arrow 15, is adjustable. For this purpose, the movable part 3 can be moved toward the bearing surface 5 or away from the bearing surface 5 by means of a linear movement oriented in or against the vertical direction 15. In order to guide this linear movement, the movable part 3 has guide holes (not illustrated), through which the guide pins 8 of the stand part 2 extend. The guide pins 8 and the guide holes thus serve as guide elements for guiding the linear movement.

It is also illustrated that spiral springs 16 are arranged between the stand part 2 and the movable part 3. In particular, the spiral springs are arranged around the guide pins 8 and are secured at one end to the rear wall 7 of the stand part 2 and at another end to the movable part 3. If the movable part 3 is moved away from the bearing surface 5 in the vertical direction 15, the spiral springs 16 are thus compressed and generate a force that is proportional to the path of displacement and that acts on the movable part 3 against the vertical direction 15. The spiral springs 16 may be biased, a spring force against the vertical direction 15 then also being exerted onto the movable part 3 when the pushing surface 12 of the movable part 3 rests on the bearing surface 5 of the stand part 2. A user must then move the movable part 3 away from the bearing surface 5 against this spring force in order to adjust a receiving volume 13 in accordance with a size of the terminal device 4 to be inserted. The terminal device 4 can then be introduced into the receiving volume 13. If the actuation force exerted onto the movable part 3 by the user is then reduced or the movable part 3 is released, the pushing surface 12 of the movable part 3 is thus moved toward the bearing surface 5 against the vertical direction 15 on account of the force generated by the spiral springs 16, whereby the terminal device 4 is clamped between the bearing surface 5 and the pushing surface 9. In this state as well, a spring force different from zero also acts on the terminal device 4 against the vertical direction 15 and is generated by the spiral springs 16.

It is also illustrated that the front wall 9 at an end opposite the base wall 11 has an outwardly curved edge 29. This will be explained in greater detail with reference to FIG. 6.

Figure 2:
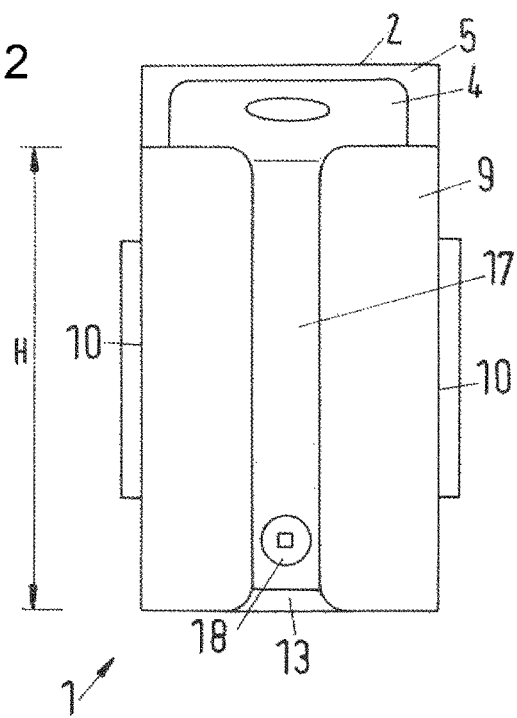
FIG. 2 shows a front view of the retaining apparatus illustrated in FIG. 1.

FIG. 2 illustrates a front view of the retaining apparatus 1 illustrated in FIG. 1. Here, it is illustrated that the front wall 9 of the movable part 3 has a recess 17 in the form of a slit, which extends over the entire height H of the front wall 9. The terminal device 4 can thus be actuated by a user from the outside, even in the held state, for example an operating element 18 of the terminal device 4 can be actuated for example by a finger of the user even in the held state. For example, a microphone (not illustrated) of the terminal device 4 also advantageously is not covered by the front wall 9, whereby a receipt of speech by the terminal device 4 is not impaired even in the held state.

Figure 3:
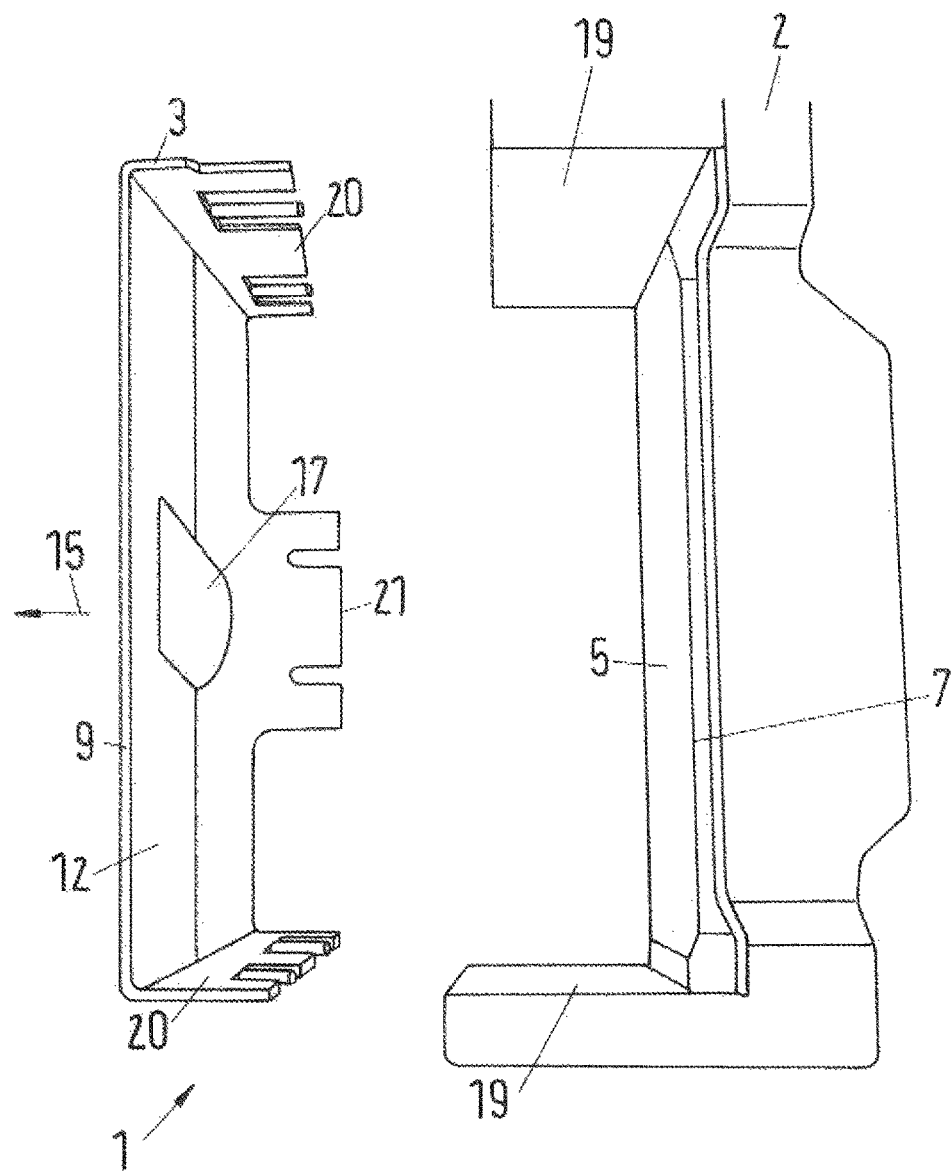
FIG. 3 shows a plan view of a stand part and a movable part of a retaining apparatus in a second embodiment.

FIG. 3 illustrates a stand part 2 and a movable part 3 of a retaining apparatus 1 in a further embodiment. The stand part 2 has a bearing surface 5. The bearing surface 5 is formed here by a front side of a rear wall 7 of the stand part 2. The stand part 2 also has side walls 19, which run perpendicularly to the rear wall 7 and are arranged on the stand part 2. The movable part 3 may be arranged in the volume encompassed by the side walls 19 and the rear wall 7. The movable part 3 has a front wall 9, which has a pushing surface 12. The movable part 3 also has side parts 20 and a base part 21. These will be described in greater detail hereinafter. It is also illustrated that the front wall 9 has a recess 17, the recess 17 extending only over part of a height of the front wall 9.

Figure 4:
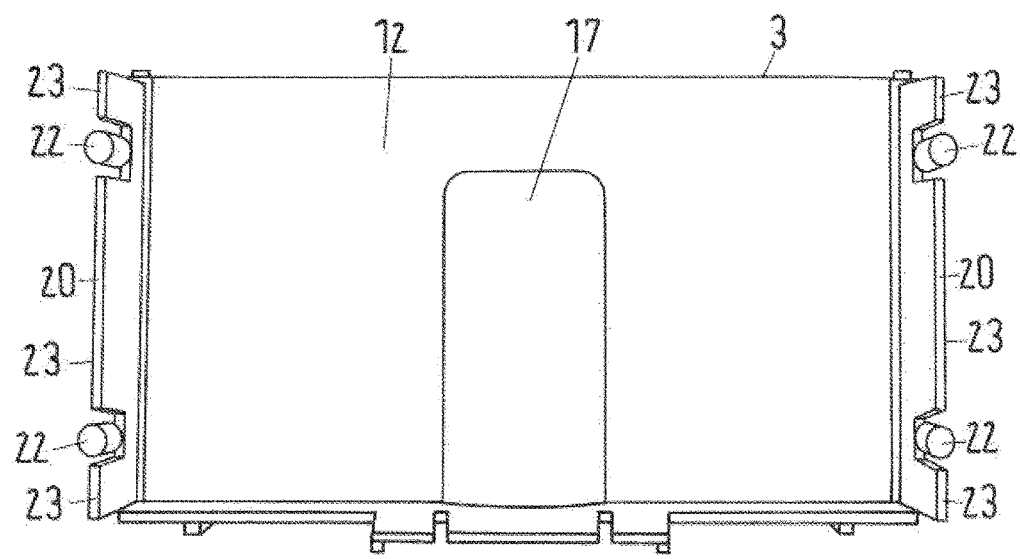
FIG. 4 shows a front view of the movable part illustrated in FIG. 3.

FIG. 4 illustrates a front view of the movable part 3 illustrated in FIG. 3. Here, the side parts 20 have guide pins 22 and guide tongues 23. If the movable part 3 is secured to the stand part 2 illustrated in FIG. 3, the guide pins 22 extend through corresponding guide holes 24 and the guide pins 23 extend through corresponding guide slits 25 (see FIG. 7). A linear movement of the movable part 3 relative to the stand part 2 in and against the vertical direction illustrated in FIG. 3 by an arrow 15 is guided with a linear movement by the guide pins 22, the guide tongues 23, the guide holes 24 and the guide slits 25.

Figure 5:
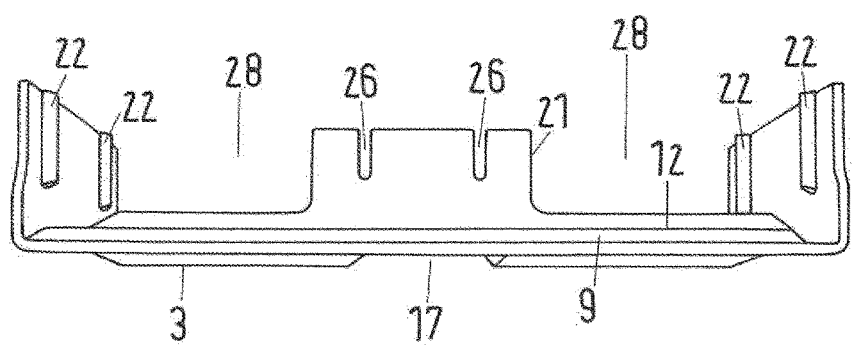
FIG. 5 shows a plan view of the movable part illustrated in FIG. 3.

FIG. 5 illustrates a plan view of the movable part 3 illustrated in FIG. 3. Here, it can be seen that the base part 21 of the movable part 3 has guide slits 26. Guide webs 27 of the stand part 2 (see FIG. 8) can be introduced into these guide slits 26 when the movable part 3 is secured to the stand part 2. This also serves to guide the previously explained linear movement of the movable part 3 relative to the stand part 2. Here it is illustrated that the base part 21 of the movable part 3 also has recesses 28. A terminal device 4 inserted into a receiving volume 13 (see FIG. 1) can thus be grasped from an underside. By way of example, the terminal device 4 inserted into the receiving volume 13 can thus be slid out from the receiving volume from the underside for removal. A removal of the terminal device 4 from the receiving volume 13 is thus facilitated.

Figure 6:
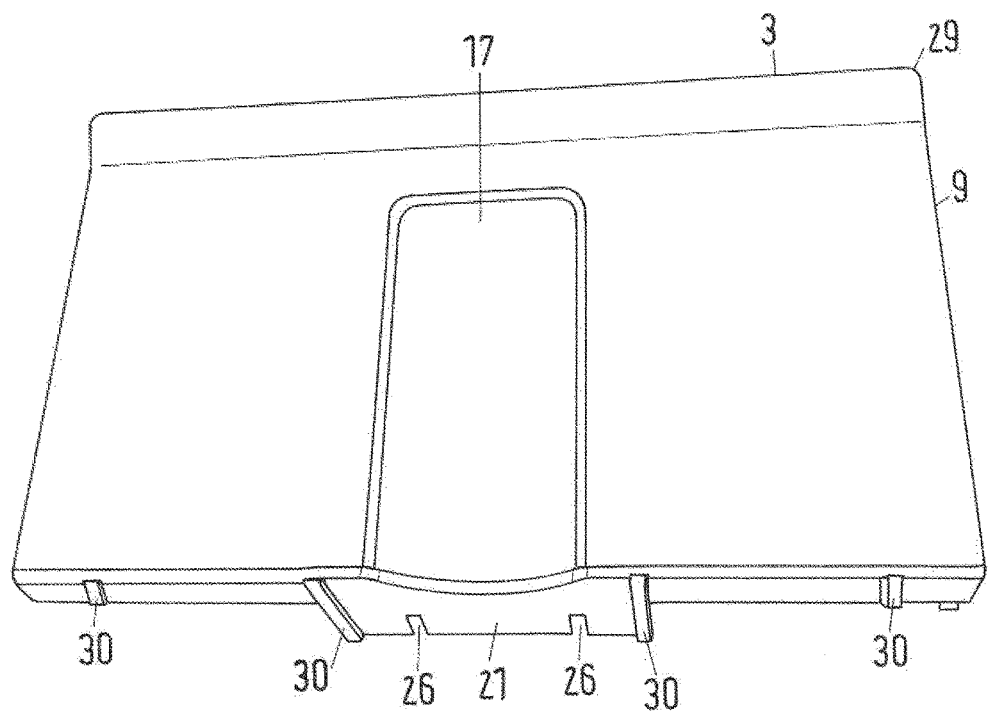
FIG. 6 shows a perspective view of the movable part illustrated in FIG. 3.

FIG. 6 illustrates a perspective view of the movable part 3, which is illustrated in FIG. 3. Here, it is illustrated that the front wall 9 at an end opposite the base part 21 has an outwardly curved edge 29. Here, outwardly curved means that, when the movable part 3 is secured to the stand part 2, the edge 29 is curved away from the bearing surface 5 in the vertical direction 15. This edge 29 serves to provide a simplified actuation, for example a simplified grasping, of the movable part 3 by a user. For example, a finger of the user can grasp behind the edge 29 from the outside, whereby the user can exert an actuation force onto the movable part 3 in such a way that the movable part 3 is moved away from the bearing surface 5 in the vertical direction 5 in order to insert a terminal device 4 (see FIG. 1). FIG. 6 also illustrates that the base part 21 also has guide webs 30, which engage with corresponding guide slits 31 (see FIG. 7) of the stand part 2 in order to guide the previously explained linear movement of the movable part 3 relative to the stand part 2. The base part 21 also has guide slits 26, with which guide webs 27 (see FIG. 8 for example) can engage.

FIG. 7 illustrates a front view of the stand part 2. Here, the bearing surface 5 and the previously explained guide holes 24, guide slits 25 and guide slits 31 are illustrated in particular. The movable part 3 may be arranged here between the side walls 19 of the stand part, whereby a lateral movement of the movable part 3 is also delimited by the side walls 19. The side walls 19 of the stand part 2 have outwardly bent edges 32 on an upper side. These edges can be used for example to secure, for example to rest, the stand part 2 on a carrier structure, for example a carrier structure arranged in a motor vehicle.

FIG. 8 illustrates a rear view of the stand part 2 illustrated in FIG. 3. Besides the guide holes 24, a rectangular opening 33 of the rear wall 7 of the stand part 2 is illustrated here in particular, into which the protruding part of the base part 21 of the movable part 3 formed by the guide slits 26 (see FIG. 6) can be introduced. In particular, the guide webs 27 are also illustrated here, which engage with the guide slits 26 in order to guide the linear movement of the movable part 3.

Figure 9:
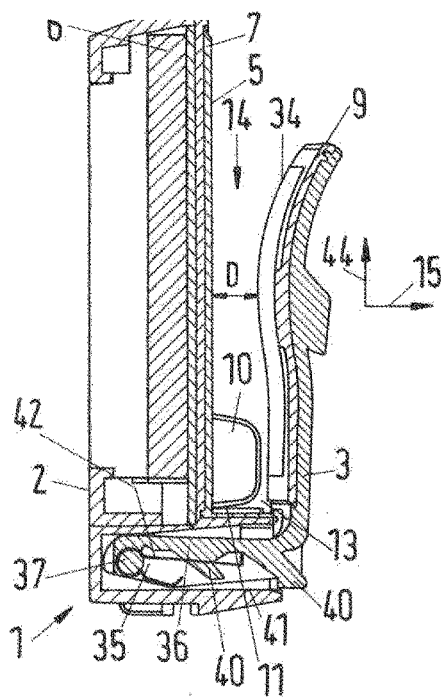
FIG. 9 shows a cross section through a retaining apparatus in a further embodiment.

FIG. 9 illustrates a cross section through a retaining apparatus 1 in a further embodiment. The retaining apparatus 1 comprises a stand part 2 and a movable part 3.

It is illustrated that the stand part 2 is formed in a number of parts. Of course, however, the stand part 2 may also be formed in one piece. A rear wall 7 of the stand part 2, which has a flat bearing surface 5 with predetermined dimensions, is also illustrated. The bearing surface 5 is formed here by a front side of the rear wall 7

Similarly to the retaining apparatus 1 illustrated in FIG. 1, the retaining apparatus 1 illustrated in FIG. 9 comprises a stand-side conductor structure, which is integrated in a carrier block 6, the carrier block 6 being arranged on a rear side of the rear wall 7 of the stand part 2 opposite the bearing surface 5. The conductor structure is thus arranged at a predetermined distance from the bearing surface 5.

In contrast to the retaining apparatus 1 illustrated in FIG. 1, the stand part 2 has a side wall 10 and a base wall 11.

The movable part 3 comprises a front wall 9, the front wall forming a surface 34 oriented toward the bearing surface 6.

The side walls 10 and the base wall 11 are each arranged here perpendicularly to the bearing surface 5. The movable part 3, in particular the front wall 9, the side walls 10 and the base wall 11 and also the stand part 2, in particular the rear wall 7 of the stand part 2, here enclose a receiving volume 13, which is open toward an end face 14 opposite the base wall 11. A terminal device 4 (see FIG. 1 for example) can thus be introduced into the receiving volume 13 from the end face 14. A vertical distance D of the surface 34 from the bearing surface 5 in the vertical direction, symbolized by an arrow 15, is adjustable.

For this purpose the stand part 2, in particular in a foot region, has a guide region 35, the guide region 35 extending in the vertical direction 15. A guide portion 36 of the movable part 3 can be arranged in the guide region 35. The guide portion 36 is formed here by a leg of the substantially L-shaped movable part 3, the leg extending in the vertical direction 15.

At a free end of the guide portion 36 the guide portion 36 has two guide pins 37, only one guide pin 37 being illustrated, however. A central axis of symmetry of the guide pin 37 is oriented parallel to the bearing surface 5 and parallel to a lateral direction 43 (see FIG. 11). The lateral direction 43 is oriented perpendicularly to the vertical direction 15 and perpendicularly to a longitudinal direction 44. The longitudinal direction 44 is oriented here from the base wall 11 to the open end face 14 of the receiving volume 13. The plane spanned by the lateral and longitudinal direction 43, 44 is parallel to the bearing surface 5. Terms such as "above" and "below" relate here to the longitudinal direction 44.

The two guide pins 37 here protrude from the free end of the guide portion 36 in opposite directions in or against the lateral direction 43.

It is also illustrated that the guide portion 36 of the movable part 3 has stop webs 40, which extend at least in part away from the guide portion 36 toward a base side 41 of the guide region 35. These stop webs 40 form stop elements, which delimit a rotational movement of the movable part 3 explained hereinafter.

A leg spring 42, which is also arranged in the guide region 35, is also illustrated. The leg spring 42 has a V-shaped profile with two legs and a spring head, the spring head being rounded. The leg spring 42 can be formed for example from a steel strip. Here, a radius of the spring head may be equal to or greater by a predetermined amount than a radius of the guide pin 37. Here, the leg spring is arranged between the guide portion 36 and the base side 41 of the guide region 35. Here, a leg of the leg spring 42 rests on an underside of the guide portion 36, and a further leg of the leg spring 42 rests on the base side 41. In the event of a rotational movement of the movable part about the axis of rotation, in particular in the mathematically negative sense, the legs are moved toward one another, whereby the leg spring 42 is tensioned and a corresponding counterforce is generated. If no external force is exerted onto the movable part 3, for example by a user, in such a rotated state, the movable part 3 thus performs a rotational movement in an oppositely oriented direction of rotation, in particular in the mathematically positive sense, on account of the counterforce, in particular until an upper side of the guide portion 36 contacts a top wall of the guide region 35. The top wall, which is arranged opposite the base side 41, thus also forms a stop element. The leg spring 42 can be biased in this state.

Figure 10:
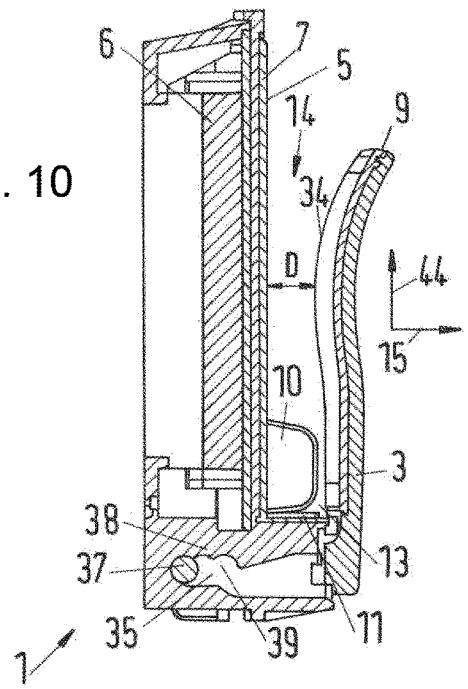
FIG. 10 shows a further cross section through the retaining apparatus illustrated in FIG. 9.

FIG. 10 illustrates a further cross section through the retaining apparatus 1 illustrated in FIG. 9. It is illustrated that the guide region 35 is arranged between side walls 38 of the stand part 2. However, only one side wall 38 is illustrated here. The side walls 38 each have a slot 39, which extends in the vertical direction 15. The guide pins 37 of the movable part 3 are each arranged here in a slot 39.

A width of the slot 39, in particular in a stand-side end portion of the slot 39, changes along the vertical direction 15. It is thus illustrated that a longitudinal side, in this case an upper longitudinal side, of the slot 39 has an undulating course. This is formed in that a profile of the longitudinal side in cross section consists of a plurality of successive circular arc segments, in particular 3 such segments. A radius of the circular arc segments here is equal to or smaller or greater by a predetermined amount than a radius of a guide pin 37.

The guide pins 37 are each movable in and against the vertical direction 15 in the corresponding slot 39, a latching position of the guide pin 37 being provided when this is arranged in a volume portion of the slot 39 corresponding to a volume delimited by one of the circular arc segments.

The guide pin 37 can then be moved out from such a latching position only when a force that is sufficient to move the guide pin 37 through the tapered portion formed between midpoints of two adjacent circular arc segments is exerted onto the movable part 3.

The movable part 3 is also mounted rotatably about an axis of rotation by the guide pins 37, which are arranged in the slots 39, the axis of rotation corresponding to the previously explained central axis of symmetry of the guide pins 37. The movable part 3 may thus perform a rotational or tilting movement. The axis of rotation can be oriented for example in parallel to a roll axis of the vehicle. The axis of rotation can also be oriented in such a way that an angular difference between the axis of rotation and the roll axis of the vehicle is smaller than a predetermined angle, for example smaller than 50°, 30° or 15°.

During a rotational movement of the movable part, the distance D between a pushing element of the movable part 3, which in particular is formed by a point, a line or a partial area and the surface 34, and the bearing surface 5 changes.

It is also illustrated in FIG. 9 and FIG. 10 that portions of the surface 34 the front wall 9 are curved with a first curvature. A first radius of curvature of these portions is determined here by an axis of curvature, which is oriented parallel to the lateral direction 43.

Figure 11:
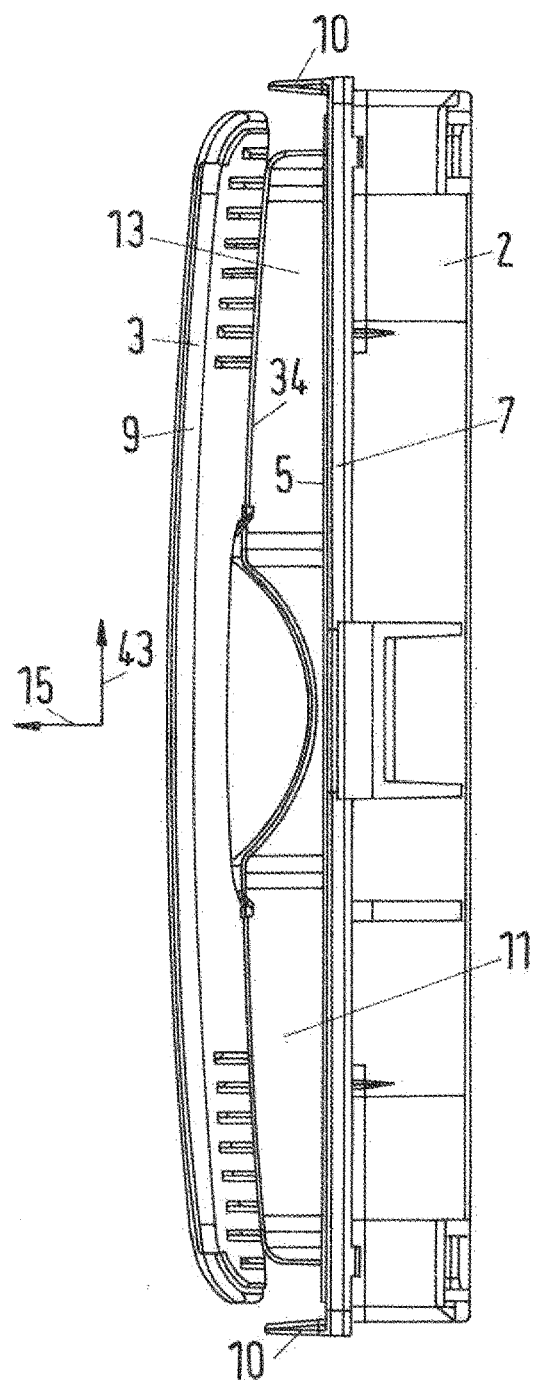
FIG. 11 shows a plan view of the retaining apparatus illustrated in FIG. 9.

FIG. 11 illustrates a plan view of the retaining apparatus 1 illustrated in FIG. 9. Here, it is also illustrated in particular that at least one portion of the surface 34 of the front wall 9 of the movable part 3 is curved with a further curvature. A further radius of curvature of this at least one portion is determined here about an axis of curvature oriented parallel to the longitudinal direction 44. Here, it is illustrated that the surface 34 has the further curvature over an entire width of the surface 34, the width being measured along the lateral direction 43.

The movable part 3 is thus in mechanical contact with an inserted terminal device 4, in particular with an edge of the terminal device 4, only at two points or along two lines on the surface 34, whereby mechanical contact between the movable part 3 and for example a display of the terminal device 4 can be avoided.

It is not illustrated in FIGS. 9, 10 and 11 that the bearing surface 5 is ribbed and rubberized. It is also not illustrated that the surface 34 is ripped and rubberized.

The invention claimed is:

1. A retaining apparatus for a wirelessly coupled terminal device, the retaining apparatus comprising:
at least one stand part and at least one movable part, said stand part having at least one bearing surface for the terminal device, said at least one movable part being movable in a vertical direction toward said at least one bearing surface;
at least one conductor structure on a rear side of a part of said at least one stand part defining said bearing surface, said conductor structure being disposed at a predetermined distance from said at least one bearing surface along the vertical direction;

said movable part having at least one pushing element and said movable part being secured movably to said stand part in such a way that a variable distance between the bearing surface and the pushing element can be set, said at least one pushing element being configured to enter into mechanical contact with a front display side of the terminal device;

said movable part being movably secured to said stand part such that said movable part is movable by a movement in translation; and said movable part being movably secured to said stand part such that said movable part is movable by a rotational movement;

said movable part being movably secured to said stand part such that an axis of rotation of the rotational movement is movable by way of the movement in translation.

2. The retaining apparatus according to claim 1, wherein said conductor structure is disposed at a predetermined spacing distance from said bearing surface and/or with a predetermined orientation relative to said bearing surface.

3. The retaining apparatus according to claim 1, which further comprises at least one device for force generation configured to apply a force oriented in a direction of said bearing surface on said movable part when a distance between said bearing surface and said pushing element is greater than zero or greater than a predetermined distance that is greater than zero.

4. The retaining apparatus according to claim 3, wherein said device for force generation is a spring element, and wherein said stand part and said movable part are mechanically connected via said spring element.

5. The retaining apparatus according to claim 1, wherein said movable part is formed with a guide and said stand part has a corresponding counter guide, and wherein said movable part is guided by said guide and said corresponding counter guide to move said at least one pushing element by way of a linear movement and/or by way of a rotational movement away from or toward said bearing surface.

6. The retaining apparatus according to claim 1, wherein one or both of said movable part and said stand part includes at least one stop element configured to delimit a movement of said movable part.

7. The retaining apparatus according to claim 1, wherein said pushing element is defined as a pushing surface and said movable part has a front wall and said front wall has said pushing surface oriented parallel to said bearing surface.

8. The retaining apparatus according to claim 7, wherein at least part of said front wall has a curved surface.

9. The retaining apparatus according to claim 7, wherein one or more of the following is true:
at least a part of said bearing surface is ribbed or grained;
at least a part of said front wall is ribbed or grained;
at least a part of said bearing surface is rubberized;
at least a part of said front wall is rubberized.

10. The retaining apparatus according to claim 7, wherein said front wall of said movable part is formed with a recess.

11. The retaining apparatus according to claim 1, wherein said pushing element has a predetermined number of pushing portions and said movable part has a front wall and said front wall has, or forms, said predetermined number of pushing portions.

12. The retaining apparatus according to claim 11, wherein at least part of said front wall has a curved surface.

13. The retaining apparatus according to claim 11, wherein one or more of the following is true:

at least a part of said bearing surface is ribbed or grained;
at least a part of said front wall is ribbed or grained;
at least a part of said bearing surface is rubberized;
at least a part of said front wall is rubberized.

14. The retaining apparatus according to claim 11, wherein said front wall of said movable part is formed with a recess.

15. The retaining apparatus according to claim 1, which further comprises at least one cushion element disposed on said stand part or on said movable part.

16. The retaining apparatus according to claim 1, wherein said bearing surface is a bearing surface for a rear side of the terminal device.

17. The retaining apparatus according to claim 1, wherein said moveable element is moved in a vertical direction toward said bearing surface, the vertical direction is oriented perpendicularly to said bearing surface.

18. A method for producing a retaining apparatus for a wireless terminal device, the method comprising:

providing a stand part formed with a bearing surface for the terminal device;

providing a movable part with at least one pushing element for entering into mechanical contact with a front display side of the terminal device, the movable part being movable in a vertical direction toward the bearing surface;

providing a conductor structure on a rear side of a part of the stand part forming the bearing surface, the conductor structure being disposed at a predetermined distance from the bearing surface along the vertical direction;

movably securing the movable part to the stand part, enabling a variable distance to be set between the bearing surface and the pushing element, the movable part being movably secured to the stand part to enable the movable part to be moved by a translatory movement; and movably securing the movable part to the stand part to enable the movable part to be moved by a rotational movement;

moveably securing the movable part to the stand part to enable an axis of rotation of the rotational movement to be moved by way of the translatory movement.

19. A retaining apparatus for a wirelessly coupled terminal device, the retaining apparatus comprising:

at least one stand part and at least one movable part, said stand part having at least one bearing surface for the terminal device;

at least one conductor structure at said at least one stand part;

said movable part having at least one pushing element and said movable part being secured movably to said stand part in such a way that a variable distance between the bearing surface and the pushing element can be set, said at least one pushing element being configured to enter into mechanical contact with a front side of the terminal device;

said movable part being movably secured to said stand part such that said movable part is movable by a movement in translation; and said movable part being movably secured to said stand part such that said movable part is movable by a rotational movement;

said movable part being movably secured to said stand part such that an axis of rotation of the rotational movement is movable by way of the movement in translation, said movable part having at least one pin with central centerline running parallel to the axis of rotation, said pin being mounted rotatably on said stand part.

\* \* \* \* \*